United States Patent [19]

Shinada

[11] 4,338,139
[45] Jul. 6, 1982

[54] METHOD OF FORMING SCHOTTKY-I²L DEVICES BY IMPLANTATION AND LASER BOMBARDMENT

[75] Inventor: Kazuyoshi Shinada, Yokohama, Japan

[73] Assignee: VLSI Technology Research Association, Japan

[21] Appl. No.: 210,749

[22] Filed: Nov. 26, 1980

[30] Foreign Application Priority Data

Nov. 29, 1979 [JP] Japan ............................ 54-154600
Nov. 29, 1979 [JP] Japan ............................ 54-154601

[51] Int. Cl.³ ................ H01L 21/263; H01L 29/48; H01L 21/285
[52] U.S. Cl. .................................. 148/1.5; 29/576 B; 29/576 T; 148/187; 357/15; 357/67; 357/91; 357/92
[58] Field of Search ............... 148/1.5, 187; 29/576 B, 29/576 T; 357/15, 92, 91, 67

[56] References Cited

U.S. PATENT DOCUMENTS

| | | | |
|---|---|---|---|
| 4,156,246 | 5/1979 | Pedersen | 357/15 |
| 4,160,989 | 7/1979 | deBrebisson et al. | 357/92 |
| 4,181,538 | 1/1980 | Narayan et al. | 148/1.5 |
| 4,214,918 | 7/1980 | Gat et al. | 148/1.5 |
| 4,229,232 | 10/1980 | Kirkpatrick | 148/1.5 |
| 4,243,433 | 1/1981 | Gibbons et al. | 148/1.5 |
| 4,254,428 | 3/1981 | Feth et al. | 357/15 |
| 4,269,631 | 5/1981 | Anantha et al. | 148/1.5 |
| 4,283,439 | 4/1981 | Higashinakagawa et al. | 357/67 |

FOREIGN PATENT DOCUMENTS 54-024574 2/1979 Japan .

OTHER PUBLICATIONS

Anantha et al., IBM-TDB, 22 (1979) 575.
Chu et al., IBM-TDB, 22 (1980) May, No. #12.
Brack et al., IBM-TDB, 19 (1976) 2592.
D. D. Tang et al., "Sub-Nanosecond Self-Aligned I²L/MTL Circuits" IEOM Technical Digest, Dec. 3-5, 1979, p. 201.

Primary Examiner—Upendra Roy
Attorney, Agent, or Firm—Finnegan, Henderson, Farabow, Garrett & Dunner

[57] ABSTRACT

A method for manufacturing a semiconductor device having a Schottky junction which comprises a process for burying first and second regions of a second conductivity type spaced from each other in a semiconductor body of a first conductivity type, a process for locally disposing a first interconnection layer made of a metal on a surface region of the semiconductor body facing the first region, a process for forming an insulating film on the surface of the first interconnection layer by subjecting the surface to anodic oxidation, a process for ion-implanting an impurity of the second conductivity type into the semiconductor body except a portion thereof under the first interconnection layer at such an energy level that the impurity may reach the first and second regions, a process for activating the ion-implanted layer by applying a laser beam thereto, and a process for forming a second interconnection layer connected with the activated layer by covering the whole surface of the semiconductor body with a metal and patterning the metal.

11 Claims, 14 Drawing Figures

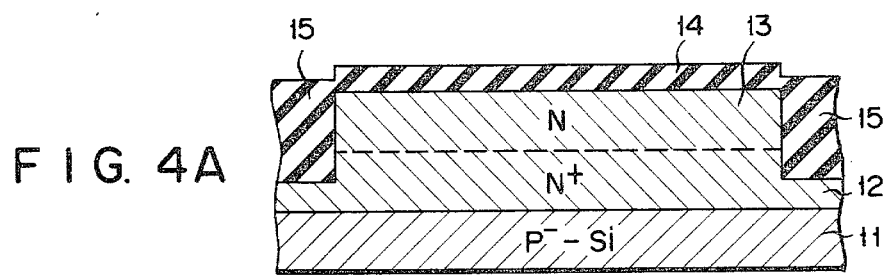
F I G. 4A
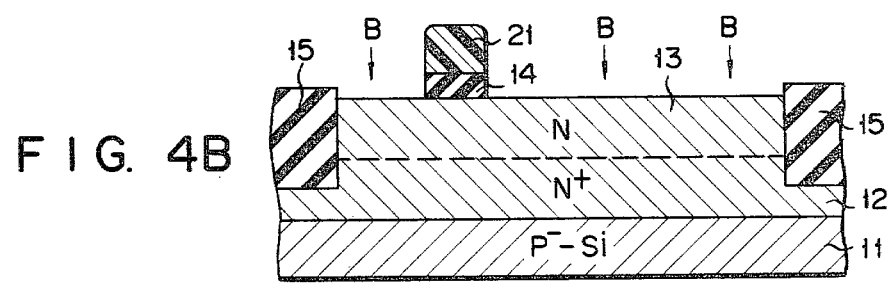
F I G. 4B
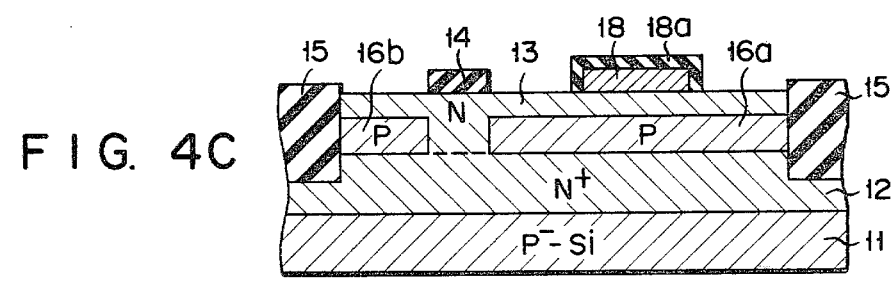
F I G. 4C
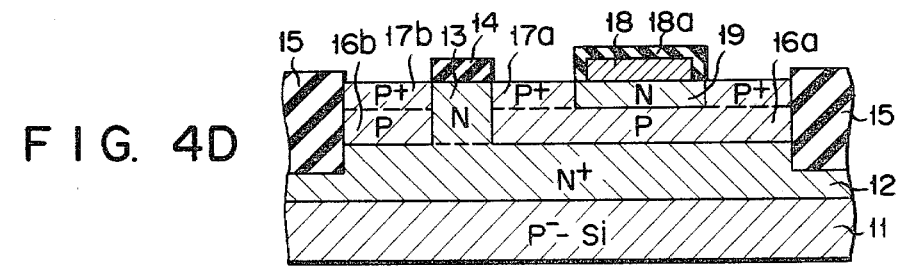
F I G. 4D

METHOD OF FORMING SCHOTTKY-I²L DEVICES BY IMPLANTATION AND LASER BOMBARDMENT

BACKGROUND OF THE INVENTION

This invention relates to a method for manufacturing a semiconductor device with a Schottky junction.

Recently, integrated injection logic circuits or I²L circuits using bipolar transistors have come to public notice as semiconductor logic circuits which ensure high integration and low power consumption. Basically, one such I²L circuit has a composite structure with the base and collector regions of a lateral PNP transistor corresponding to the emitter and base regions of a vertical NPN transistor, respectively. In the I²L, the lateral PNP transistor serves as a current injector for the vertical NPN transistor, while the vertical NPN transistor functions as an inverter, thereby performing logical operation. Usually, however, the vertical NPN transistor is inversely constructed with respect to its collector and emitter, so that the area of the emitter-base junction is very large. Therefore, minority carriers injected through the emitter-base junction biased in the forward direction are stored in the whole base region. In consequence, the I²L becomes susceptible to saturation, thereby inhibiting high-speed operation. Accordingly, there have conventionally been tried various methods to reduce the minority carriers stored in the base region as a whole and hence to speed up operation for the improvement of the performance of the circuit as a logic element by (i) reducing the external base resistance,
(ii) augmenting the current amplification factor,
(iii) increasing the ratio of the collector area to the emitter area, and
(iv) connecting a Schottky barrier diode to the collector to reduce the logic amplitude.

However, many technical problems still remain to complicate the manufacture of high speed operation I²L circuits with satisfactory characteristics, especially I²L circuits provided with a Schottky junction. Thus, a conventional method for manufacturing I²L circuits with the Schottky junction involves complicated processes and low productivity, failing to provide I²L circuits with high reliability, high integration, and low power consumption.

SUMMARY OF THE INVENTION

The object of this invention is to provide a method for manufacturing a semiconductor device with a Schottky junction ensuring high reliability, high integration, and low power consumption through simple, high-productivity processes.

According to a first embodiment of the invention, there is provided a method for manufacturing a semiconductor device comprising the step of burying first and second regions of a second conductivity type spaced from each other in a semiconductor body of a first conductivity type, the step of locally disposing a first interconnection layer made of a metal on a surface region of the semiconductor body facing the first region, the step of forming an insulating film on the surface of the first interconnection layer by subjecting the surface to anodic oxidation, the step of ion-implanting an impurity of the second conductivity type into the semiconductor body except a portion thereof under the first interconnection layer at such an energy level that the impurity may reach the first and second regions, the step of activating the ion-implanted layer by applying a laser beam thereto, and the step of forming a second interconnection layer connected with the activated layer by covering the whole surface of the semiconductor body with a metal and patterning the metal.

According to a second embodiment of the invention, there is provided a method for manufacturing a semiconductor device comprising the step of burying first and second regions of a second conductivity type spaced from each other in a semiconductor body of a first conductivity type, the step of locally disposing a first interconnection layer on a surface region of the semiconductor body facing the first region, an impermeable-to-ion material layer wider than the first interconnection layer being provided on the top of the first interconnection layer, the step of ion-implanting an impurity of the second conductivity type into the semiconductor body with the aid of the impermeable-to-ion material layer as a mask at such an energy level that the impurity may reach the first and second regions, the step of activating the ion-implanted layer by applying a laser beam thereto, the step of forming an insulating film on the surface of the first interconnection layer by subjecting the surface to anodic oxidation, and the step of forming a second interconnection layer connected with the activated layer by covering the whole surface of the semiconductor body with a metal and patterning the metal.

BRIEF DESCRIPTION OF THE DRAWING

This invention can be more fully understood from the following detailed description when taken in conjunction with the accompanying drawings, in which:

FIGS. 4A to 4D are sectional views for illustrating several steps for manufacturing the Schottky I²L of FIGS. 2 and 3;

This invention provides a method for manufacturing a semiconductor device, especially an I²L with a Schottky barrier diode by means of simple manufacturing processes, effectively making use of a technique of insulation by anodic oxidation of the surface of an interconnection layer and a technique of electrical activation of an ion-implanted layer by laser irradiation.

DETAILED DESCRIPTION OF THE PREFERRED EMBODIMENT

Now there will be described in detail the method of this invention applied to a Schottky I²L.

Figure 1:
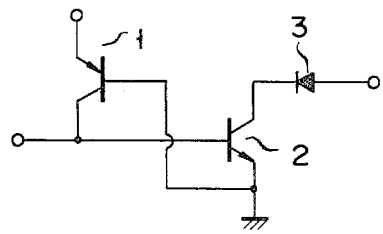
FIG. 1 shows an equivalent circuit of a Schottky I²L produced by a method according to an embodiment of this invention.
Figure 2:
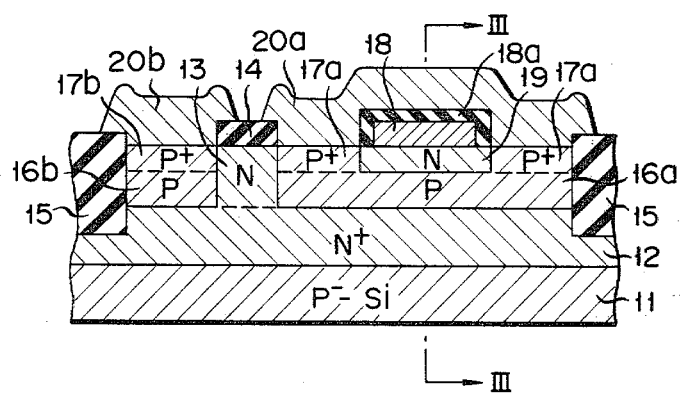
FIG. 2 is a sectional view of the Schottky I²L of FIG. 1.
Figure 3:
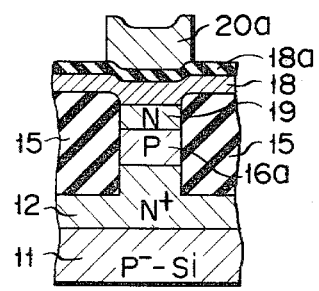
FIG. 3 is a sectional view taken along line III—III of FIG. 2.

FIG. 1 is an equivalent circuit diagram of an I²L (Schottky I²L) provided with one Schottky barrier diode produced according to an embodiment of this invention. In FIG. 1, the base and collector of a lateral PNP transistor 1 are connected to the emitter and base of a vertical NPN transistor 2, respectively. The collector of the vertical NPN transistor 2 is connected with the cathode of a Schottky barrier diode 3. FIG. 2 is a sectional view showing the construction of the Schottky I²L as shown in FIG. 1, and FIG. 3 is a sectional view taken along line III—III of FIG. 2. In FIGS. 2 and 3, an N+-type buried layer 12 is formed on a P−-type silicon substrate 11, and an N-type epitaxial layer 13 is formed on the N+-type buried layer 12. An oxide layer 14 is partially provided on the surface of the N-type epitaxial layer 13, and the N-type epitaxial layer 13 and the N+-type buried layer 12 are selectively oxidized to form an isolation region 15. First and second P-type regions 16a and 16b are severally buried in those portions on the N+-type buried layer 12 which are divided by the N-type epitaxial layer 13, and P+-type regions 17a and 17b are formed on the surfaces of the first and second P-type regions 16a and 16b, respectively. The surface layer of the semiconductor surrounded by the first P-type region 16a and the P+-type region 17a is left as an N-type epitaxial layer 19. A first interconnection layer 18 is formed on the N-type epitaxial layer 19, and an insulating film 18a is formed by anodic oxidation on the top and side faces of the first interconnection layer 18. Severally formed on the surface of the semiconductor thus constructed are second interconnection layers 20a and 20b that are divided by the oxide layer 14.

In the Schottky I²L of the aforementioned construction, a junction between the N−-type epitaxial layer 19 forming the collector of the vertical NPN transistor 2 and the first interconnection layer 18 formed on the layer 19 constitutes the Schottky barrier diode 3. The first interconnection layer 18 and the second interconnection layer 20a are entirely isolated from each other by the insulating film 18a. The vertical NPN transistor 2 has the P-type buried layer 16a as its base and the N-type epitaxial layer 13 and the N+-type buried layer 12 as its emitter, the P-type buried layer 16a being in ohmic contact with the second interconnection layer 20a through the P+-type region 17a. On the other hand, the lateral transistor 1 has the P-type region 16b as its emitter, the N-type epitaxial layer 13 as its base, and the P-type region 16a as its collector. The P-type region 16b functioning as the emitter is in ohmic contact with the second interconnection layer 20b through the P+-type region 17b.

In the aforementioned transistor structure, the N-type epitaxial layer 13 functions both as the base of the lateral PNP transistor 1 and the emitter of the vertical NPN transistor 2. Likewise, the P-type region 16a functions both as the collector of the lateral PNP transistor 1 and the base of the vertical NPN transistor 2. Thus, there is materialized a Schottky I²L in which the Schottky barrier diode 3 is connected to the vertical NPN transistor 2.

Referring now to the drawings of FIGS. 4A to 4E, there will be described a method for manufacturing the above-mentioned Schottky I²L.

First, the N+-type buried layer 12 with for example sheet resistance $\rho s$ of 20 $\Omega/\square$ and junction depth Xj of 1.0 $\mu$m is formed by subjecting the surface of the P−-type silicon substrate 11 with a resistivity of 30 to 50 $\Omega$cm to As-diffusion with an As-doped oxide layer as a diffusion source, and the N-type epitaxial layer 13 with a resistivity of for example 1 $\Omega$cm is formed to a thickness of 1.2 $\mu$m on the layer 12. Thereafter, the N-type epitaxial layer 13 is selectively anisotropically etched to a depth of 0.75 $\mu$m with an Si₃N₄ film and a buffer oxide film as oxidation-resisting masks, and is then subjected to selective oxidation to form the oxide isolation region 15 with a thickness of 1.5 $\mu$m. At this time, the substantial thickness of the N-type epitaxial layer 13 is reduced to approximately 0.7 $\mu$m diffusion of As from the N+-type buried layer 12 into the epitaxial layer 13. Subsequently, after the masks are removed, the structure is subjected to oxidation in a wet oxidation atmosphere at 1,000° C. for 45 minutes to form the oxide film 14 with a thickness of 0.3 $\mu$m on the surface of the epitaxial layer 13. This stage of manufacture is shown in FIG. 4A.

Then, as shown in FIG. 4B, the oxide film 14 is patterned with a resist film 21 as a mask, and then boron are implanted into the resultant structure at an energy of 190 keV with a dose of $8 \times 10^{12}$ cm$^{-2}$. In this case, if the resist film 21 is formed approximately 1 $\mu$m thick, the boron will never be implanted into that region of the N-type epitaxial layer 13 right under the oxide film 14 which serves as the base of the lateral PNP transistor 1. After the implantation of boron the resist film 21 is removed.

Subsequently, the ion-implanted layer is electrically activated by heat treatment in a nitrogen atmosphere at approximately 900° C. for 20 minutes, and the first and second P-type regions 16a and 16b are separately formed, as shown in FIG. 4C. Then aluminum is deposited to a thickness of 1.0 $\mu$m on the N-type epitaxial layer 13 by vacuum evaporation. The resultant aluminum layer is patterned with a resist film 22 as a mask, and the first interconnection layer 18 is locally formed on the N-type epitaxial layer 13 located on the first P-type region 16a.

Thereafter, the structure is subjected to anodic oxidation in a 6-% oxalic acid solution with a current density of 2 mA/cm² for approximately 10 minutes, thereby forming the insulating film 18a made of Al₂O₃ of 0.5-$\mu$m thickness on the top and side faces of the first interconnection layer 18. At the time of such anodic oxidation, the surfaces of the N-type epitaxial layer 13, in which the P+-type regions 17a and 17b will be formed, are oxidized to a depth of approximately 300 Å. A resultant thin oxide layer may, however, be removed by e.g. immersion in an NH₄F solution for about 30 seconds. Namely, the thin oxide layer can be removed by self-aligning. Thus, the Schottky barrier diode 3 with barrier height $\phi_B$ of 0.66 eV is formed out of the first interconnection layer 18 covered with the Al₂O₃ film 18a and the N-type epitaxial layer 13.

Subsequently, boron is implanted into the whole surface of the structure at an energy of 40 keV and a dose of $1 \times 10^{15}$ cm$^{-2}$, with and then a CW-type Kr laser beam of e.g. 6-W output and 40 $\mu$m spot diameter is applied in a scanning manner for several milliseconds to electrically activate the ion-implanted layer. As a result, the P+-type regions 17a and 17b with sheet resistance ρs of e.g. 100 Ω/□ are formed severally, as shown in FIG. 4D. with such irradiation conditions for the laser beam, the concentration profile of the impurity immediately after the ion implantation may be maintained.

Thereafter, the second interconnection layers 20a and 20b are formed for example by depositing an aluminum layer to a thickness of 0.8 μm on the whole surface of the structure and patterning the aluminum layer. Thus, the Schottky I$^2$L as shown in FIGS. 2 and 3 is completed. The second interconnection layers 20a and 20b form satisfactory ohmic contacts with the P+-type regions 17a and 17b, respectively.

Although an I$^2$L with a single Schottky barrier diode has been described hereinbefore, this invention may also be applied to an I$^2$L having two Schottky barrier diodes.

Figure 5:
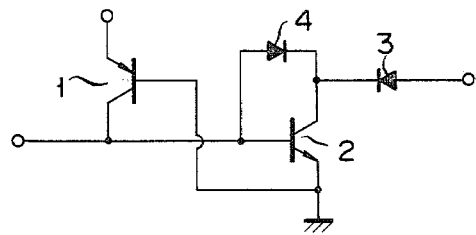
FIG. 5 shows an equivalent circuit of a Schottky I²L produced by a method according to another embodiment of the invention.

FIG. 5 is an equivalent circuit diagram of a Schottky I$^2$L provided with two Schottky barrier diodes produced according to another embodiment of the invention. In FIG. 5, the base and collector of the lateral PNP transistor 1 are connected to the emitter and base of the vertical NPN transistor 2, respectively. The collector of the vertical NPN transistor 2 is connected with the cathode of the first Schottky barrier diode 3, and a second Schottky barrier diode 4 is connected in parallel with the collector and base of the transistor 2 so that its cathode may be connected to the collector. For the operation of such Schottky I$^2$L, the forward voltage $V_F$ of the second Schottky barrier diode 4 needs to be higher than the forward voltage $V_F$ of the first Schottky barrier diode 3. This requirement can be fulfilled by, for example, making the junction area of the first diode 3 greater than that of the second diode 4 or by varying the materials of the interconnection layers so as to vary the Schottky barrier heights of the first and second diodes 3 and 4.

Figure 6:
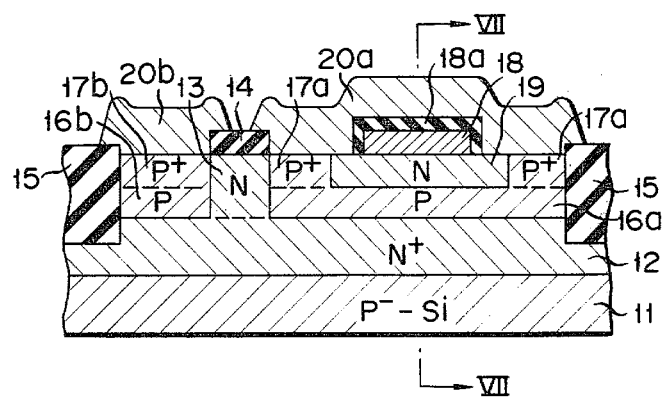
FIG. 6 is a sectional view of the Schottky I²L of FIG. 5.
Figure 7:
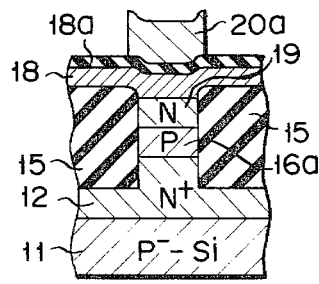
FIG. 7 is a sectional view taken along line VII-VII of FIG. 6.

FIG. 6 is a sectional view showing the construction of the Schottky I$^2$L as shown in FIG. 5, and FIG. 7 is a sectional view as taken along line VII—VII of FIG. 6. The Schottky I$^2$L shown in FIGS. 6 and 7 has the same construction as and the one shown in FIGS. 2 and 3 except that the N-type epitaxial layer 19 under the first interconnection layer 18 is wider than the first interconnection layer 18, so that the second interconnection layer 20a and the N-type epitaxial layer 19 form a junction around the first interconnection layer 18. This junction corresponds to the second Schottky barrier diode 4, and the first Schottky barrier diode 3, like the one shown in FIGS. 2 and 3, is formed out of the first interconnection layer 18 and the N-type epitaxial layer 19.

Now there will be described the process for manufacturing the above-mentioned Schottky I$^2$L with two Schottky barrier diodes.

Figure 8A:
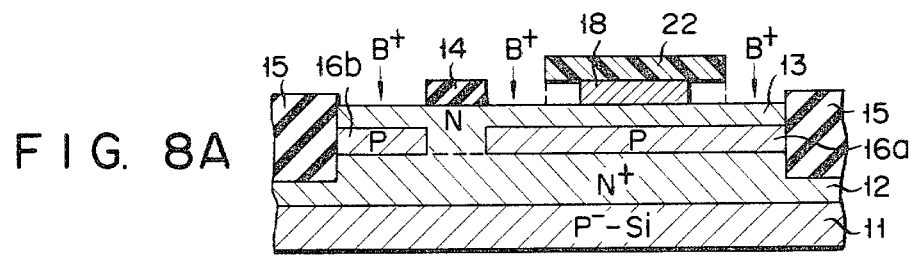
FIGS. 8A and 8B are sectional views for illustrating steps for manufacturing the Schottky I²L of FIGS. 6 and 7.

Since the steps are the same as for the aforementioned manufacturing process for the Schottky I$^2$L with a single Schottky barrier diode except that the second Schottky barrier diode is additionally formed and hence the sequence is varied with respect to the anodic oxidation, the steps which are only different will be described below. When the aluminum layer is deposited on the whole surface of the structure after the same steps as shown in FIGS. 4A and 4B, it is patterned but in a different way. Namely, as shown in FIG. 8A, the aluminum layer is overetched with the resist film 22, as a mask, which is wider than the area required for the first interconnection layer 18, thereby forming the first interconnection layer 18 narrower than the resist film 22.

The first Schottky barrier diode 3 with barrier height $\phi_B$ of 0.66 eV is formed out of the first interconnection layer 18 thus formed and the N-type epitaxial layer 13. Then, boron ions are implanted into the structure at an energy of 40 keV with a dose of $1 \times 10^{15}$ cm$^{-2}$ with the aid of the resist film 22 of ion-impermeable material as a mask, and thereafter the resist film 22 is removed.

Figure 8B:
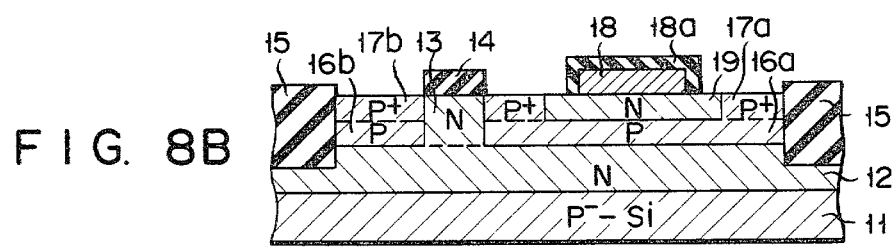

Subsequently, a CW-type Kr laser beam for example of 6-W output and 40 μm spot diameter, is applied in a scanning manner for several milliseconds to electrically activate the ion-implanted layer. As a result, the P+-type regions 17a and 17b with sheet resistance ρs of 100 Ω/□ are formed severally, as shown in FIG. 8B. With such irradiation conditions for the laser beam, the concentration profile of the impurity (boron) immediately after the ion implantation may be maintained without varying the base length. If the crystal of the ion-implanted layer is broken to a certain degree, the energy absorption efficiency of the laser beam will be increased. Thereafter, boron is preferably implanted with a dose of $10^{15}$ cm$^{-2}$ or higher in order to obtain further satisfactory ohmic contact. Since the laser beam is entirely reflected by the surface of the first interconnection layer 18, it will never exert any bad influence upon the Schottky junction or the P-type region 16a under the first interconnection layer 18.

Thereafter, as shown in FIG. 8B, the first interconnection layer 18 is subjected to anodic oxidation to form the insulating film 18a in the same manner as the process shown in FIG. 4C, and then the second interconnection layers 20a and 20b electrically separated from each other are formed in the same manner as the structure shown in FIG. 2 except for the use of Al-Si instead of Al. The second interconnection layer 20a is electrically isolated from the first interconnection layer 18 by the insulating layer 18a, forming a Schottky junction around the first interconnection layer 18 between itself and the N-type epitaxial layer 19. Thus, the second Schottky barrier diode 4 with barrier height $\phi_B$ of 0.76 eV is formed out of the second interconnection layer 20a made of Al-Si and the N-type epitaxial layer 19. Naturally, the second interconnection layers 20a and 20b form satisfactory ohmic contacts with the P+-type regions 17a and 17b, respectively.

Thus, the Schottky I$^2$L with the two Schottky barrier diodes of the construction as shown in FIGS. 5 and 6 is produced by the above-mentioned processes.

According to this invention, as illustrated in connection with the above two examples, the P+-type region 17a as the base contact with the vertical NPN transistor, the first Schottky barrier diode (first interconnection layer 18), and the second Schottky barrier diode (second interconnection layer 20a) can be formed in self-alignment. Therefore, the ratio of the collector area to emitter area of the vertical NPN transistor may be made great enough, and the external base resistance may be reduced by a large margin. As a result, it become possible to substantially increase the speed of logical operation of the I$^2$L, as well as to reduce the logic amplitude by means of the Schottky barrier diode. Further, the manufacturing processes are simple ones utilizing conventional techniques, so that an improvement in productivity can be expected. Moreover, the I$^2$L obtained by the method of the invention can ensure high reliability, high integration, and low power consumption.

Figure 9:
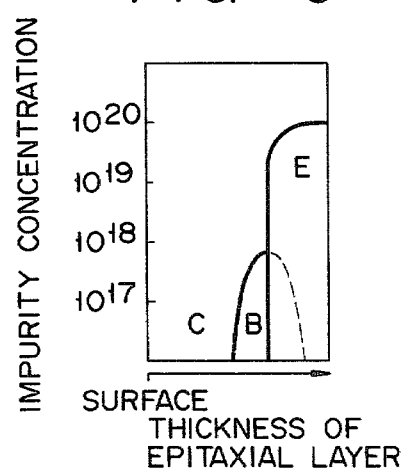
FIG. 9 shows the impurity concentration profile of a transistor.
Figure 10:
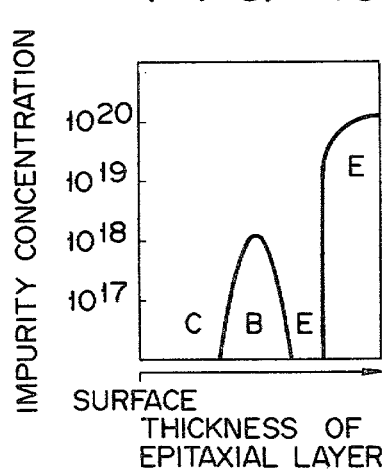
FIG. 10 shows a modification of the impurity concentration profile of the transistor.

This invention is not limited to the above-mentioned two embodiments, and various changes and modifications may be effected without departing from the scope or spirit of the invention. For example, although in the above embodiments the N+-type buried layer 12 serving as the emitter of the vertical NPN transistor is brought in contact with the P-type buried layer 16a serving as the internal base to idealize the impurity profile of the transistor in the epitaxial layer, as shown in FIG. 9, the I²L may be made compatible with a linear transistor by thickening the N-type epitaxial layer to increase the withstand voltage of the transistor. Further, the first interconnection layer may be formed out of molybdenum and the second interconnection layer may be formed out of three-layer structure consisting of PtSi, TiW, and Al, Al-Si or Al-Cu-Si, so as to form a first Schottky barrier diode with barrier height $\phi_B$ of 0.59 eV and a second Schottky barrier diode with barrier height $\phi_B$ of 0.83 eV. Moreover, the first interconnection layer may be made of Al-Si, or Al-Cu-Si. Furthermore, the forward voltage $V_F$ may suitably be set by adjusting the Schottky junction area. Additionally, an Xe or Ar laser beam with substantially the same wavelength as the Kr laser beam may be used for the electrical activation of the impurity region.

What is claimed is:

1. A method for manufacturing a semiconductor device comprising:
    the step of burying the first and second regions of a second conductivity type spaced from each other in a semiconductor body of a first conductivity type;
    the step of locally disposing a first interconnection layer made of a metal on a surface region of said semiconductor body facing said first region;
    the step of forming an insulating film on the surface of said first interconnection layer by subjecting said surface to anodic oxidation;
    the step of ion-implanting an impurity of said second conductivity type into said semiconductor body except a portion thereof under said first interconnection layer at such an energy level that said impurity may reach said first and second regions;
    the step of activating said ion-implanted layer by applying a laser beam thereto; and
    the step of forming a second interconnection layer connected with said activated layer by covering the whole surface of said semiconductor body with a metal and patterning said metal.

2. A method according to claim 1, wherein said first interconnection layer is made of a metal seleted among a group of metals including Al, Al-Si, Al-Cu-Si and Mo.

3. A method according to claim 1 or 2, wherein said second interconnection layer is made of Al, Al-Si, Al-Cu-Si, or three-layer structure of PtSi, TiW and one member selected from the group consisting of Al, Al-Si and Al-Cu-Si.

4. A method according to claim 1 further comprising the step of removing an oxide layer formed on the surface of said semiconductor body during said anodic oxidation.

5. A method according to claim 1, wherein said first and second regions are buried or formed by ion-implanting an impurity into said semiconductor body with the aid of a resist film on an oxide layer partially formed on the surface of said semiconductor body as a mask.

6. A method for manufacturing a semiconductor device comprising:
    the step of burying the first and second regions of a second conductivity type spaced from each other in a semiconductor body of a first conductivity type;
    the step of locally disposing a first interconnection layer on a surface region of said semiconductor body facing said first region, an ion-impermeable material layer wider than said first interconnection layer being provided on the top of said first interconnection layer;
    the step of ion-implanting an impurity of said second conductivity type into said semiconductor body with the aid of said ion-impermeable material layer as a mask at such an energy level that said impurity may reach said first and second regions;
    the step of activating said ion-implanted layer by applying a laser beam thereto;
    the step of forming an insulating film on the surface of said first interconnection layer by subjecting said surface to anodic oxidation; and
    the step of forming a second interconnection layer connected with said activated layer by covering the whole surface of said semiconductor body with a metal and patterning said metal.

7. A method according to claim 6, wherein said first interconnection layer with said ion-impermeable material layer on the top thereof is formed by covering the whole surface of said semiconductor body with a metal layer and overetching said metal layer with the aid of said ion-impermeable material layer, as a mask, formed of a photoresist film wider than the area in which said first interconnection layer is disposed.

8. A method according to claim 6, wherein said first interconnection layer is made of a metal selected among a group of metals including Al, Al-Si, Al-Cu-Si and Mo.

9. A method according to claim 8, wherein said second interconnection layer is made of Al, Al-Si, Al-Cu-Si, or three-layer structure of PtSi, TiW and one member selected from the group consisting of Al, Al-Si and Al-Cu-Si.

10. A method according to claim 6 further comprising the step of removing an oxide layer formed on the surface of said semiconductor body during said anodic oxidation.

11. A method according to claim 6, wherein said first and second regions are buried or formed by ion-implanting an impurity into said semiconductor body with the aid of a resist film on an oxide layer partially formed on the surface of said semiconductor body as a mask.

* * * * *